United States Patent [19]
Becker

[11] Patent Number: 5,550,922
[45] Date of Patent: Aug. 27, 1996

[54] VEHICLE RADIO AUTOMATIC VOLUME ADJUSTMENT SYSTEM

[75] Inventor: Raimund Becker, Hildesheim, Germany

[73] Assignee: Blaupunkt-Werke GmbH, Hildesheim, Germany

[21] Appl. No.: 288,563

[22] Filed: Aug. 10, 1994

[30] Foreign Application Priority Data

Aug. 27, 1993 [DE] Germany .................... 43 28 798.0

[51] Int. Cl.$^6$ ................................. H03G 3/20
[52] U.S. Cl. ............................ 381/57; 381/104
[58] Field of Search ................... 381/57, 104–108

[56] References Cited

U.S. PATENT DOCUMENTS

| | | | |
|---|---|---|---|
| 4,479,237 | 10/1984 | Sugasawa | 381/57 |
| 4,628,526 | 12/1986 | Germer | 381/57 |
| 5,054,078 | 10/1991 | Schorman et al. | 381/57 |
| 5,081,682 | 1/1992 | Kato et al. | 381/57 |
| 5,243,657 | 9/1993 | Cotton | 381/57 |

FOREIGN PATENT DOCUMENTS

2370376  6/1978  France.

OTHER PUBLICATIONS

IEEE Transactions on Consumer Electronics, vol. CE–27, No. 3, Aug. 1981, New York, pp. 227–223, T. Taniyama "Automatic loudness adjusting circuits for automotive audio systems."

*Primary Examiner*—Stephen Brinich
*Attorney, Agent, or Firm*—Frishauf, Holtz, Goodman, Langer & Chick, P.C.

[57] ABSTRACT

The invention relates generally to a method for adjusting the volume of a vehicle radio to the surrounding noise level, where the audio signal level, sampled downstream of a setting element (2), placed in the path of the audio signal, and a driving noise signal level (FG) are supplied to a control loop (1, 2, V1) that attempts to minimize the difference between the audio signal level and the driving noise signal level. To prevent the signal level from running up during a signal pause and a driving noise level at hand, an audio signal pause recognition is provided which identifies low-signal audio passages as pauses, using a variable threshold, and slowly lowers the audio signal level during these pauses.

6 Claims, 2 Drawing Sheets

5,550,922

VEHICLE RADIO AUTOMATIC VOLUME ADJUSTMENT SYSTEM

Cross-reference to related patent and application, assigned to the assignee of the present invention, the disclosures of which are hereby incorporated by reference U.S. Pat. No. 4,628,526, GERMER 9 Dec. 1986, METHOD & SYSTEM FOR MATCHING THE SOUND OUTPUT OF A LOUDSPEAKER TO THE AMBIENT NOISE LEVEL, published German patent application DE 37 41 253, filed 1987 (R. 1975).

FIELD OF THE INVENTION

The invention relates generally to a method for adjusting the volume of a mobile sound reproduction unit to the surrounding noise level.

BACKGROUND

With such a method, the volume is set according to the noise level that is present in the area of the loudspeaker in such a manner that the sound reproduction level of the loudspeaker, that is the wanted signal level, is always a few Decibel (dB) above the noise interference level. In this manner, the wanted signal given off by the loudspeaker is perceived by the listener to remain at approximately the same volume, independent of the level of the surrounding noise. Especially for mobile operation of a loudspeaker, or the radio receiver, this results in a significant improvement in comfort, since the listener is not forced to constantly adjust the volume when the noise level changes often.

The control circuit used for adjusting the volume attempts to continuously minimize the difference between the audio frequency level and the noise level. For a stabilized control situation, the difference is minimal. However, if for instance a pause occurs in the audio signal and the noise level remains the same, the control voltage for the control circuit, taken from the level comparator circuit, suddenly assumes a high value, which increases the amplification factor of the control element, or decreases the attenuation of transmission of the control element respectively. If the pause is ended abruptly with a loud audio signal, the volume is briefly too high; a sound reproduction control operation occurs that is perceived as unpleasant. For this discussion, a pause is defined as a time span with a negligible audio signal level, for instance the pause between two words in a speech signal. To avoid the disturbing effects caused by the pauses, pauses must be recognized as such. When determining a pause with a threshold, it is of little use to define a fixed threshold, set sufficiently for the largest occurring noise levels. In such a case, in an audio signal selection with almost no interference (e.g., from a compact disk, i.e., a CD), low passages that are worth boosting would drop below such a threshold. On the other hand, with a fixed threshold optimized for low-interference signal sources, background noise of lower quality audio signal sources may be evaluated as wanted signals, and boosted.

THE INVENTION

It is an object of the invention to provide a method of adjusting the volume of a vehicle radio to the surrounding noise level that clearly recognizes audio signal pauses as such, and, as much as possible, avoids volume jumps caused by such pauses.

Briefly, this is accomplished by feeding an ambient noise level signal FG to one input of a comparator, whose output signal regulates the volume adjustment system.

The advantages accomplished with this invention consist, in particular, of a definite recognition of audio signal pauses by this method, even at varying interference levels, which as much as possible prevents audio signal jumps perceived to be disturbing.

With the additional feature of applying an external control signal to the setting element, the audio signal level is noticeably lowered during a relatively long pause. This is reasonable, since the longer the pause lasts, the more different (thus also louder) the beginning level of the audio signal at the end of the pause can be from the audio signal level at the beginning of the pause. For a relatively short pause, the difference at the pause borders is in all probability a small one, necessitating no major decrease as protective measure. With the additional feature of performing comparisons with an envelope signal, pause recognition additionally can be stabilized in an advantageous manner.

DRAWINGS

Further features of the preferred embodiment will be apparent from the drawings, of which FIG. 1 is a schematic block diagram of a device for adjusting the volume;

FIG. 2 is a diagram showing the chronological course of an audio signal envelope curve and the integrator output signal in a time interval surrounding an identified signal pause; and FIG. 3 is an expanded schematic block diagram of a device wherein an offset voltage is supplied to a level comparator stage.

DETAILED DESCRIPTION

Figure 1:
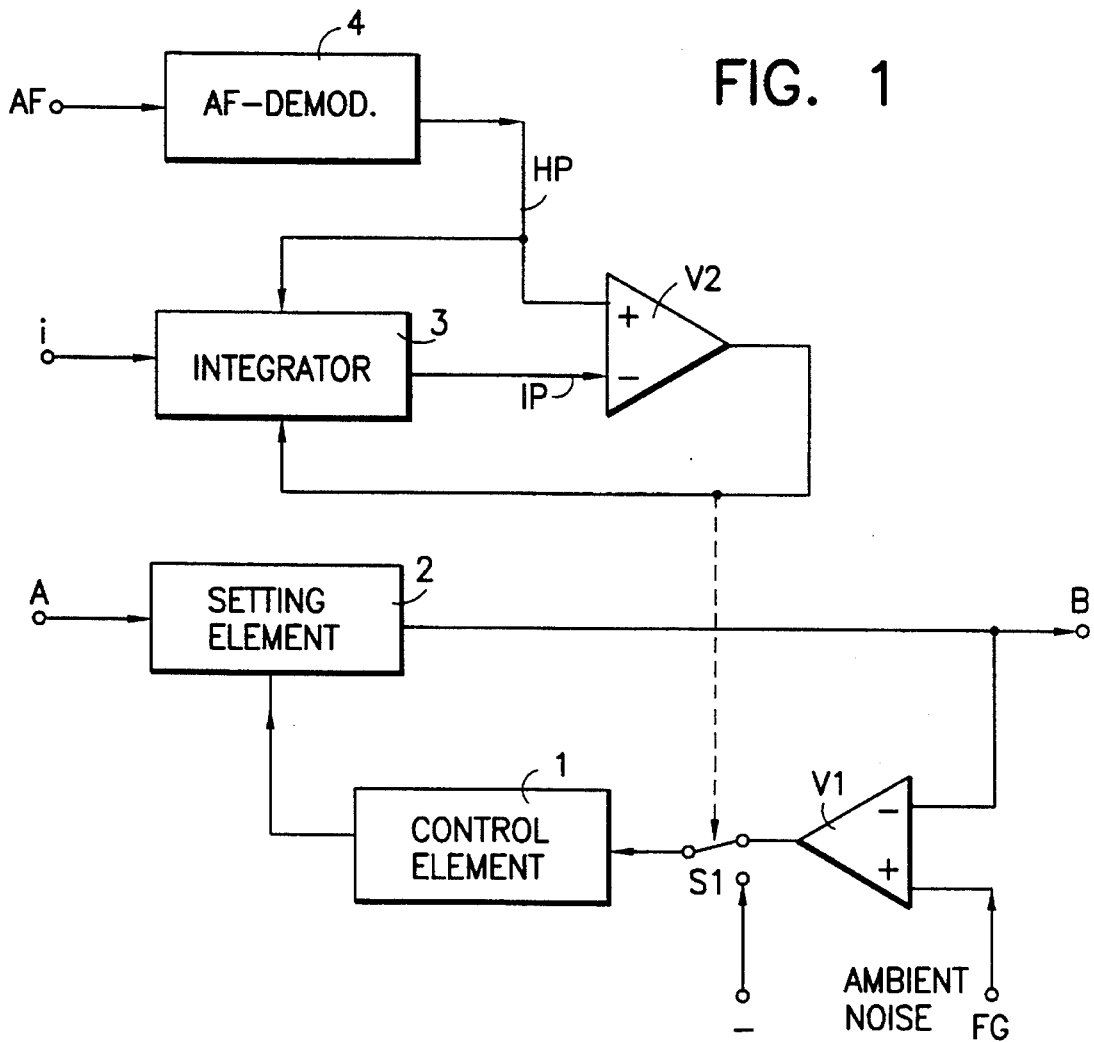

As shown in FIG. 1, a setting element 2, which is controlled by a control element 1, is provided in the audio signal path A-B of a car radio (not shown). The input of the control element 1, designed as an I-controller, is connected to the output of an operational amplifier V1, serving as first level comparator stage, via a first electronic changeover or toggle switch S1 in its first switch position. The inverting input of the op amp V1 is connected to the output of the setting element 2. The driving noise signal FG, obtained in a known manner, e.g., as described in Published German patent disclosure DE 37 41 253, is supplied to the non-inverting input. In its second switch position, the electronic toggle switch S1 supplies a negative voltage constant to the input of the control element 1. The output of an operational amplifier V2, serving as second level comparator stage, is connected with the control input of the electronic toggle switch S1 and with a first reset input of an integrator 3. The output of integrator 3 is connected with the inverting input of the operational amplifier V2 whose non-inverting input is connected to the output of an audio signal envelope demodulator 4, which preferably consists of a rectifier followed by an average value formation stage. In an analog implementation, a low-pass filter could be substituted for the average-formation stage. In addition, the output of the envelope demodulator 4 is connected to a second reset input of integrator 3. The input of integrator 3 is supplied with pulses i from a pulse generator (not shown). In a generally known manner, the first level comparator stage V1, together with the control element 1 and the setting element 2, form a feedback control loop which attempts, in a first switch position of switch S1, to minimize the difference between the audio signal level and the ambient driving noise level.

To recognize signal pauses, or similarly, quiet musical passages, a signal taken from the audio signal path A-B is supplied to the audio signal envelope demodulator 4, which features a full-wave rectifier and a device for signal smoothing.

Figure 2:
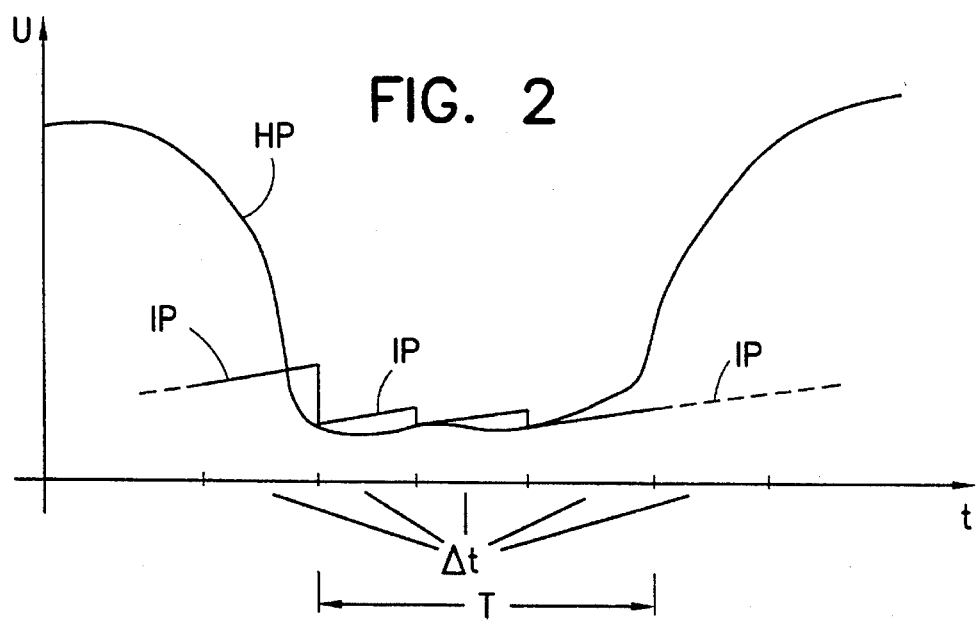

As can be seen in FIG. 2, the integrator output level IP increases continuously, as long as it is smaller than the level of the audio signal envelope curve HP. Levels IP and HP are compared to one another at freely selectable time intervals Δt. If, at the moment of sampling, IP is greater than HP, level IP is set back to the value of level HP in integrator 3, and the first changeover or toggle switch S1 is set to the second switch position. Level IP now continues to increase until the next sampling point or instant. As long as IP is greater than HP, the output signal of V2 is negative, and the level of IP is set back to the level of HP at sampling. If IP is smaller than HP, the level increase of IP continues and the output signal of V2 is positive. A negative output signal of V2 is identified as a pause. During a pause, identified in this manner, the control loop is interrupted with the toggle switch S1 and the control element 1 is controlled by the negative voltage constant such that the setting element 2 slowly lowers the level of the audio signal. At the end of the pause, the control loop is reactivated. Of course, it is also possible not to lower the audio signal level during a pause, but to influence it in some other ways, or to keep it constant.

Figure 3:
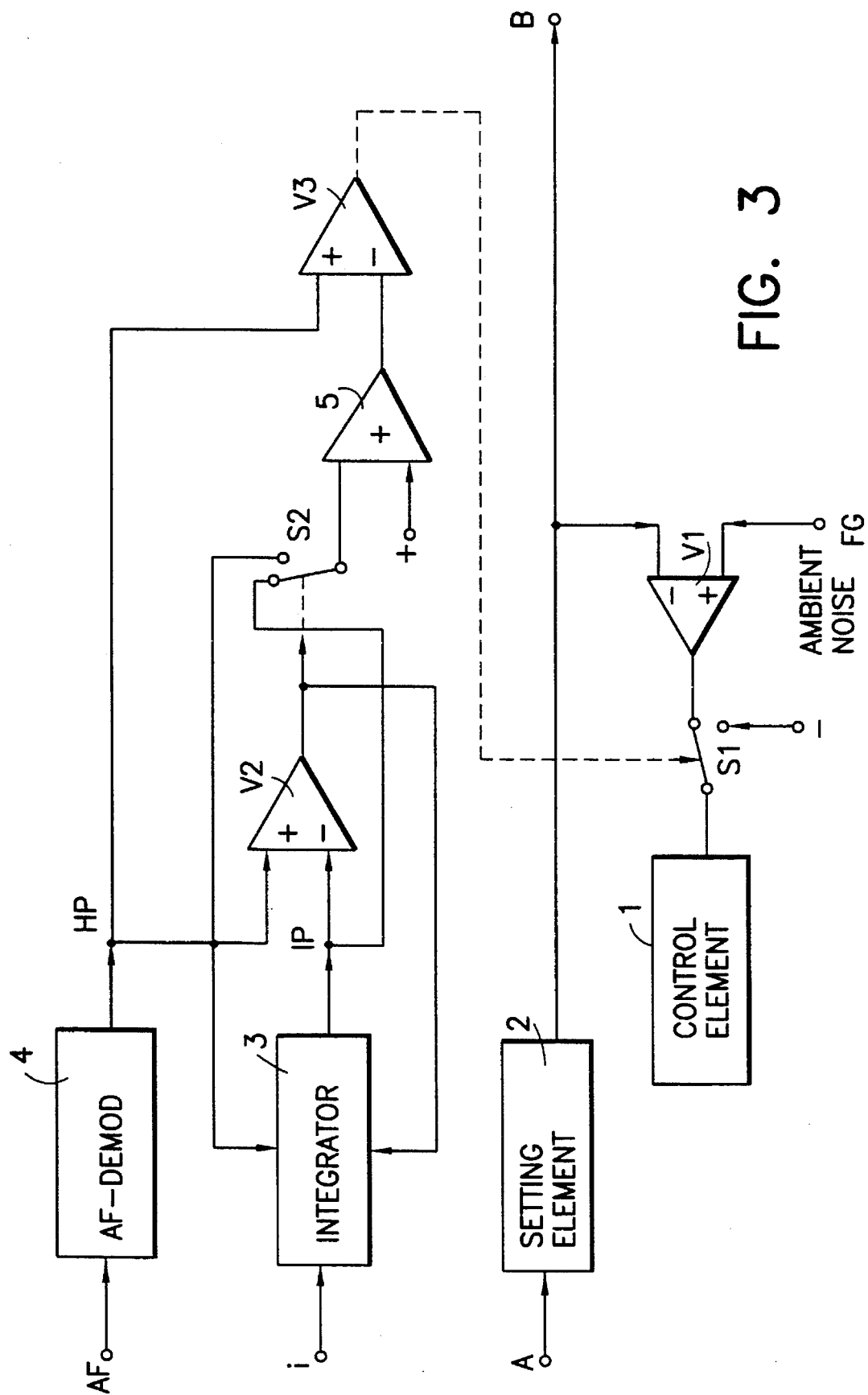

In a refinement of the device, as shown in FIG. 3, an offset voltage can be fed into the pause recognition circuit using an adder element 5. With this design, the first toggle switch S1 is driven by the output of an operational amplifier V3 serving as a third level comparator stage. The non-inverting input of op amp V3 is connected to the output of envelope demodulator 4, and its inverting input to the output of adder element 5.

A second electronic changeover or toggle switch S2, driven by the output of the second level comparator stage V2, connects an input of adder element 5 in a first switch position with the output of integrator 3 and in a second switch position with the output of envelope demodulator 4. In a second level comparator stage V2, with this feature, the envelope signal levels are compared, during a pause determined by the second level comparator stage, to envelope signal levels boosted by the amount of the offset voltage, and outside of such pauses to the integrator output levels boosted by the amount of the offset voltage. This achieves an additional stabilizing effect on pause identification and associated switching.

Various changes and modifications are possible within the scope of the inventive concept. In particular, features of one embodiment may be combined with features of another embodiment.

What is claimed is:

1. A method of adjusting the volume of a mobile sound reproduction unit having first (V1) and second (V2) level comparator stages, to an ambient:driving noise level (FG), comprising the steps of feeding an audio signal level, sampled in a signal path (A-B) of the reproduction unit, downstream of a setting element (2), and a driving noise signal level (FG) to said first level comparator stage (V1), said first comparator, a control element (1) connected to an output of said first comparator (V1) and said setting element (2) together forming a feedback control loop (1, 2, V1) which attempts to minimize the difference between the audio signal level and the driving noise signal level;

comparing in a second level comparator stage (V2), at preset time intervals, an envelope curve level (HP) of the audio signal to a continuously increasing output signal (IP) of a resettable integrator (3);

wherein, as long as, at the moment of comparison, the envelope curve level (HP) is greater than the integrator output level (IP), the integrator output signal (IP) continues to increase and the feedback control loop is operative; and wherein, as long as, at the moment of comparison, the envelope curve level (HP) is smaller than the integrator output level (IP), the feedback control loop (1, 2, V1) of the control circuit is inoperative and the integrator output level (IP) is set back to the present value of the audio envelope curve level (HP), from which position it increases until the next moment of comparison; and wherein, for the duration of each period identified as an audio signal pause (T), the setting element (2) is supplied with a control signal that influences the level of the audio signal; and wherein the control loop (1, 2, V1) becomes operative again immediately after the end of an audio signal pause (T).

2. A method of adjusting the volume according to claim 1, wherein during the duration of an audio signal pause (T), the audio signal level in said signal path (A-B) is slowly lowered.

3. A method of adjusting the volume according to claim 1, wherein an external control signal is supplied to the control element (2) during the time of the audio signal pause (T), said external control signal being of such a nature that it continuously lowers the audio signal level.

4. A method of adjusting the volume according to claim 1, wherein switching of the control loop (1,2, V1) is accomplished via a third level comparator stage (V3), where the envelope curve level (HP), other than during the time of the audio signal pause (T) identified by the second level comparator stage (V2), is compared to the integrator output signal (IP) boosted by the amount of the offset voltage, and during the time of the determined audio signal pause (T) is compared to the envelope curve signal (HP) boosted by the amount of the offset voltage, where these signals are supplied to the third level comparator stage (V3) via an adder element (5), which boosts the signals by the amount of an offset voltage.

5. A device for implementing a method according to claim 1, where the input of the control element (1) is connected, via an electronically controllable changeover switch (S1), in a first switch position of said changeover switch (S1), to an output of a first level comparator stage (V1), and, in a second switch position of said changeover switch (S1), to a control voltage source, wherein the input terminal for the audio signal is connected to a first input of the second level comparator stage (V2) via an envelope demodulator (4);

wherein the output of the integrator (3) is connected to a second input of the second level comparator stage (V2);

wherein the output of the second level comparator stage (V2) is connected to the control input of the first changeover switch (S1) as well as to a control input, serving as reset input, of the integrator (3);

wherein the output of the envelope demodulator (4) is connected to another control input of the integrator (3); and wherein the input of the integrator (3) is connected to a pulse source (i).

6. A device for implementing a method according to claim 4, where the input of the control element is connected via an electronically controllable first changeover switch (S1) to the output of the first level comparator stage in a first switch position, and in a second switch position to a control voltage source, wherein the input terminal for the audio signal is connected to the first input of the second level comparator stage (V2) via an envelope demodulator (4);

wherein the output of the integrator (3) is connected to the second input of the second level comparator stage (V2);

wherein the output of the second level comparator stage (V2) is connected to the control input of a second electronic changeover switch (S2) as well as to the control input, serving as reset input, of the integrator (3);

wherein the output of the third level comparator stage (V3) is connected to the control input of the first electronic changeover switch (S1);

wherein the first input of the third level comparator stage is connected to the output of the envelope demodulator (4); and wherein the second input of the third level comparator stage (V3) is connected to the output of the adder element (5) whose one input is connected via the second electronic toggle switch (S2), selectively, to the output of the integrator (3), or to the output of the envelope demodulator (4).

* * * * *